United States Patent [19]

Gamo et al.

[11] 4,304,043

[45] Dec. 8, 1981

[54] PROCESS FOR PREPARING SEMICONDUCTOR DEVICE BY FORMING REINFORCING REGIONS TO FACILITATE SEPARATION OF PELLETS

[75] Inventors: Hiroshi Gamo; Shigeru Hokuyo; Takeshi Yamamoto; Takahiko Ichimura, all of Itami, Japan

[73] Assignee: Mitsubishi Denki Kabushiki Kaisha, Tokyo, Japan

[21] Appl. No.: 137,971

[22] Filed: Apr. 7, 1980

Related U.S. Application Data

[63] Continuation of Ser. No. 853,744, Nov. 21, 1977, abandoned.

[30] Foreign Application Priority Data

Nov. 30, 1976 [JP] Japan .................................. 51/144311
Nov. 30, 1976 [JP] Japan .................................. 51/144312
Dec. 15, 1976 [JP] Japan .................................. 51/151075

[51] Int. Cl.³ ...................... H01L 21/78; H01L 21/80
[52] U.S. Cl. .................................. 29/580; 29/578; 29/583; 29/588; 29/413; 156/645; 156/649; 156/657; 357/55; 357/56
[58] Field of Search ............... 29/578, 580, 576 S, 29/412–414, 583, 588; 156/657, 662, 645, 649; 357/55, 56

[56] References Cited

U.S. PATENT DOCUMENTS

| 3,427,708 | 2/1969 | Schutze et al. | 29/580 |
| 3,493,820 | 2/1970 | Rosvold | 29/580 X |
| 3,513,022 | 5/1970 | Casterline et al. | 156/657 |
| 3,716,429 | 2/1973 | Napoli et al. | 29/580 X |
| 3,783,044 | 1/1974 | Cheskis et al. | 29/583 X |
| 3,928,094 | 12/1975 | Angell | 29/578 X |
| 3,941,625 | 3/1976 | Kennedy et al. | 148/175 X |
| 3,968,563 | 7/1976 | Hamlin | 29/576 S |
| 3,972,113 | 8/1976 | Nakata et al. | 29/580 |
| 4,102,732 | 7/1978 | Kato et al. | 29/580 X |

Primary Examiner—L. Dewayne Rutledge
Assistant Examiner—W. G. Saba
Attorney, Agent, or Firm—Oblon, Fisher, Spivak, McClelland & Maier

[57] ABSTRACT

A process for preparing semiconductor pellets from one sheet of a semiconductor wafer is disclosed. In the process of the invention, the semiconductor wafer is divided into a plurality of pellet-forming regions and reinforcing regions are formed between the pellet forming regions and at the peripheral part of the wafer.

The reinforcing regions prevent breakage of the wafer without increasing the thickness of the pellets whereby a wafer having a large diameter can be used to obtain many pellets having suitable characteristics from one sheet of the wafer without substantial loss.

8 Claims, 14 Drawing Figures

PROCESS FOR PREPARING SEMICONDUCTOR DEVICE BY FORMING REINFORCING REGIONS TO FACILITATE SEPARATION OF PELLETS

This is a continuation of application Ser. No. 853,744, filed Nov. 21, 1977, now abandoned.

BACKGROUND OF THE INVENTION

1. Field of the Invention

The present invention relates to a process for preparing semiconductor devices. More particularly, it relates to a process for preparing a plurality of semiconductor pellets from one sheet of a semiconductor wafer.

2. Description of the Prior Art

It has been well known to prepare many semiconductor pellets as semiconductor devices in one sheet of a semiconductor wafer in a preparation of semiconductor elements for semiconductor devices. This process is remarkably effective for lowering a processing cost especially in planar type semiconductor devices requiring many steps in a processing of a wafer and glass passivation mesa type semiconductor devices forming a protection of junction exposed surface in the form of a wafer.

Figure 1:
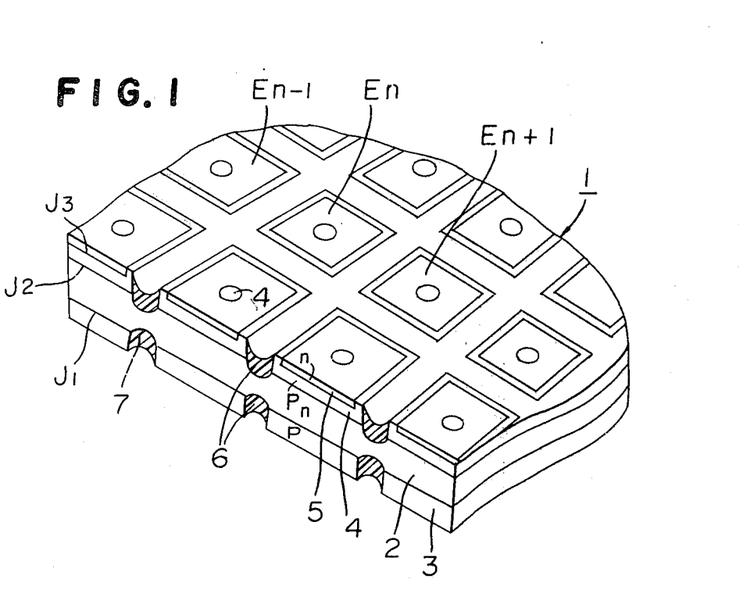
FIG. 1 is a partially broken schematic view of a semiconductor wafer structure forming mesa-type thyristor devices in a whole surface.

FIG. 1 is a partially broken schematic view of a semiconductor wafer structure forming many mesa type thyristor devices which has a surface protection, wherein a p-type anode layer (3) is formed on one surface of the n-type substrate (2) of a semiconductor wafer (1) and a p-type base layer (4) is formed on the rare surface and n-type cathode layers (5) which are separated for each of thyristor pellets E are formed in the p-type base layer (4), whereby each pellet E has pnpn structure and junctions $J_1$, $J_2$ and $J_3$ are formed between the layers.

The pellets E formed in the semiconductor wafer (1) are respectively separated by grooves (6) shaved on both surfaces of the wafer (1) between them. The grooves are called as mesa grooves and shaved in deeper than the junctions $J_1$ and $J_2$ to separate the p-type anode layer (3), p-type base layer (4), n-type cathode layers (5) and the junctions $J_1$, $J_2$ and $J_3$ for the pellets, however, the n-type substrate (2) for the n-type base layer is not separated to maintain the shape of the wafer (1). In the condition, the surface protective material (7) is applied in the mesa grooves (6) to electrically and mechanically protect and stabilize the junctions exposed in the mesa grooves (6). The surface protective material (7) can be silicon oxide film, silicone rubber and frit. The semiconductor wafer (1) having the surface protective material is divided along the mesa grooves (6) to form thyristor pellets E.

In accordance with the process for preparing the semiconductor pellets, the surface protective treatment can be applied simultaneously for many semiconductor pellets in a form of a wafer and the processing efficiency is higher and the processing cost for preparing semiconductor devices can be remarkably lowered in comparison with the process for applying the protective surface treatment on the surfaces of pellets after separating the wafer into pellets in the step of forming pn-junctions. It is possible to simultaneously attain the diffusion and the formation of electrodes by one step even in the case of planar type devices. Accordingly this process for preparing pellets is remarkably effective.

A number of pellets formed in one sheet of a wafer is increased by increasing the area of the semiconductor wafer to prepare more pellets by one operation and to decrease the processing cost. Accordingly, it is preferable to use a larger wafer. However, when a diameter of the wafer is larger, the wafer is easily broken in the process for preparing pellets and the processing cost disadvantageously increases. When the semiconductor wafer having the mesa grooves is processed, for example, frit is applied in the mesa grooves having a depth of 50 to 70$\mu$ formed on the semiconductor wafer having a diameter of 40 mm, it is necessary to use the wafer having a thickness of more than 220-240$\mu$ in order to prevent the break of the wafer because the thermal expansion coefficient of the frit is higher than that of the silicon to cause the strain in the calcination of the frit. The wafer having a diameter requires a thickness of more than 250-270$\mu$ and the wafer having a diameter of 75 mm requires a thickness of more than 330-350$\mu$.

When the planar type devices are formed on a semiconductor wafer, the wafer having a diameter of 40 mm requires a thickness of more than 180$\mu$; the wafer having a diameter of 50 mm requires a thickness of more than 220$\mu$; the wafer having a diameter of 65 mm requires a thickness of more than 270$\mu$ and the wafer having a diameter of 75 mm requires a thickness of more than 300$\mu$.

From the viewpoint of characteristics of the semiconductor device, the increase of the thickness of the wafer causes the increase of forward voltage drop or the decrease of over current endurance and the substantial decrease of current capacity, disadvantageously, in the case of devices for passing current in the direction perpendicular to the wafer surface such as diodes and thyristors. Accordingly, the thickness of the wafer is limited from this viewpoint. From the viewpoint of the other characteristics, a thyristor having a withstand voltage of 500-600 V requires a thickness of the wafer of 180 to 220$\mu$. When the thickness of the wafer is more than 220$\mu$, the forward voltage drop disadvantageously increases. Accordingly, it has been difficult to use a wafer having a diameter of more than 50 mm for a preparation of thyristors.

SUMMARY OF THE INVENTION

It is an object of the present invention to provide a process for preparing semiconductor pellets for semiconductor devices having suitable characteristics from one sheet of a wafer which have larger diameter without increasing the thickness of the semiconductor devices and without substantial loss.

The foregoing and other objects of the present invention have been attained by dividing a semiconductor wafer into a plurality of pellet-forming regions and forming reinforcing regions in suitable pattern of the reinforcing regions without uniformly forming semiconductor pellets in a semiconductor wafer.

DETAILED DESCRIPTION OF THE PREFERRED EMBODIMENTS

Referring to the drawings, the process of the present invention will be illustrated.

Figure 2:
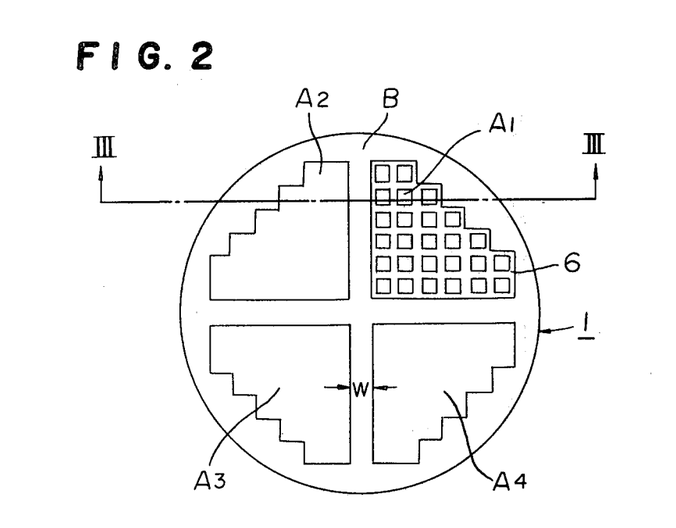
FIG. 2 is a plane view of one embodiment of a semiconductor wafer prepared by the process of the present invention.

In FIG. 2, the semiconductor wafer (1) has four pellet-forming regions $A_1$, $A_2$, $A_3$ and $A_4$ and the reinforcing regions B are formed between the pellet-forming regions $A_1$–$A_4$ and the peripheral parts thereof.

In the reinforcing regions B, pellets are not formed without shaving the mesa groove (6) whereby the reinforcing regions B have higher mechanical strength in comparison with the pellet-forming regions $A_1$ to $A_4$, and the semiconductor wafer (1) is reinforced by the reinforcing regions B. In each of the pellet forming regions $A_1$ to $A_4$, a plurality of semiconductor pellets E are formed. The processing steps of preparing the pellets in the pellet-forming regions $A_1$ to $A_4$ are the same with those of ones shown in FIG. 1. The description of the processing steps is omitted.

According to the experiments, the percents of defective caused by break of wafers are as follows when the silicon wafer (1) having a diameter of 65 mm and a thickness of $250\mu$ is used and the mesa grooves (6) having a depth of 70 to $80\mu$ are shaved to form pellets E having a length of 3.6 mm and a width of 3.6 mm and the frit (7) is applied in the mesa grooves in maximum thickness of $45\mu$.

(A) The pellet-forming regions $A_1$ to $A_4$ are spread to peripheral part of the wafer (1) and the reinforcing regions B are remained in + shape between the pellet-forming regions $A_1$ to $A_4$. The percents of defective in the widths W of the reinforcing regions B are as follows.

| | | Percent of defective |
|---|---|---|
| 1 | W = 0 (no reinforcing region) | 100% |
| 2 | W = 1 mm | 50 to 60% |
| 3 | W = 3 mm | 20 to 30% |
| 4 | W = 4 mm | less than 5% |
| 5 | W = 5 mm | 0 |

(B) The reinforcing region B is also formed at the peripheral part. The percents of defective in the widths W of the reinforcing region B are as follows.

| | | Percent of defective |
|---|---|---|
| 1 | W = 1 mm | 25 to 50% |
| 2 | W = 3 mm | less than 10% |
| 3 | W = 4 mm | 0 |

It is clear from the results that the reinforcing regions B impart excellent effect, especially, they impart excellent effect in the case forming the reinforcing regions B at the peripheral part as well as the internal parts even though the width W of the reinforcing region B is narrow.

The break of the wafer is decreased and the percent of defective is lowered by increasing the reinforcing region B, however the area of the pellet-forming regions $A_1$ to $A_4$ is decreased and the yield of the pellets E is lowered. Accordingly, the size of the reinforcing regions B is limited.

In the above-mentioned case, when the width W is 3.5 mm and the reinforcing regions B are formed at the peripheral part as well as the internal part of the wafer (1) and the yield of pellets E per one sheet of the wafer having a diameter of 5 mm is given as 100, the yields were respectively 139 and 191 in the case of the diameter of the wafer of 65 mm and 75 mm. The processing cost can be reduced and the total cost can be also reduced by using a larger wafer.

In accordance with the present invention, the wafer having larger diameter can be used by forming the reinforcing region whereby the processing cost per a pellet can be reduced.

The case having the same thickness for both of the pellet-forming regions $A_1$ to $A_4$ and the reinforcing regions B has been illustrated. The reinforcing effect can be further improved by increasing the thickness of the reinforcing regions B.

Figure 3:
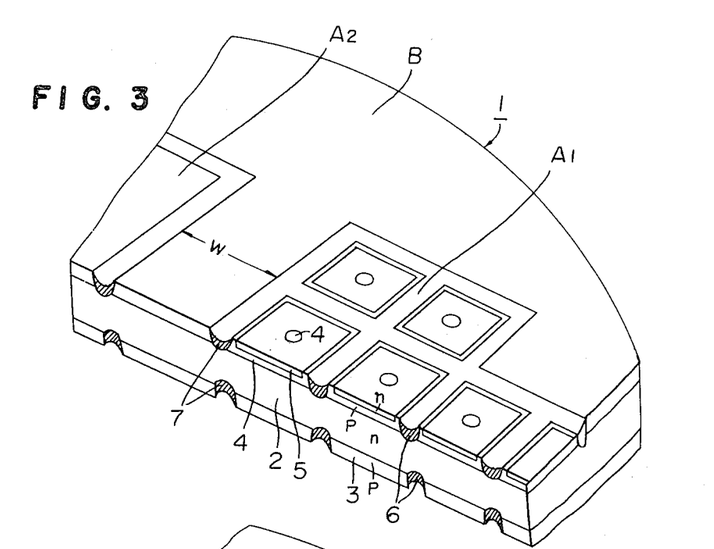
FIG. 3 is a sectional view taken along the III—III line of FIG. 2.
Figure 4:
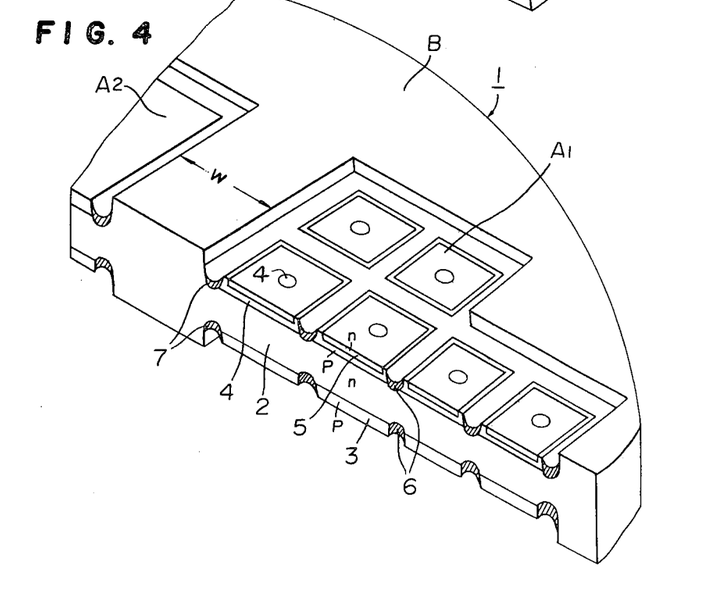
FIG. 4 is a partial schematic view of the other embodiment of the semiconductor wafer prepared by the process of the present invention.

FIG. 4 shows the other embodiment of the semiconductor wafer used in the process of the present invention, and it is a partial schematic view of the semiconductor wafer corresponding to FIG. 3.

In FIG. 4, the thickness of the reinforcing regions B of the wafer (1) is thicker than the thickness of the pellet-forming regions $A_1$ to $A_4$.

In the embodiment of FIG. 3, the wafer (1) having a thickness of $250\mu$ is used. However, in the embodiment of FIG. 4, the wafer having a thickness of 410 to $450\mu$ is used, the pellet-forming regions $A_1$ to $A_4$ are chemically etched to a thickness of 80 to $100\mu$. Thus, the thickness of the reinforcing region can be kept in 410 to $450\mu$ though the thickness of the pellet-forming regions $A_1$ to $A_4$ is $250\mu$ as the same with the former case. The steps of forming pellets E in the pellet-forming regions $A_1$ to $A_2$ are the same with those of the former case.

The reinforcing effect can be maintained by increasing the thickness of the reinforcing region B even though the area of the reinforcing region B on the surface of the wafer (1) is narrow, that is, the width W is thin. Accordingly, the yield of the pellets E can be increased to reduce the processing cost of the pellets E.

Figure 5:
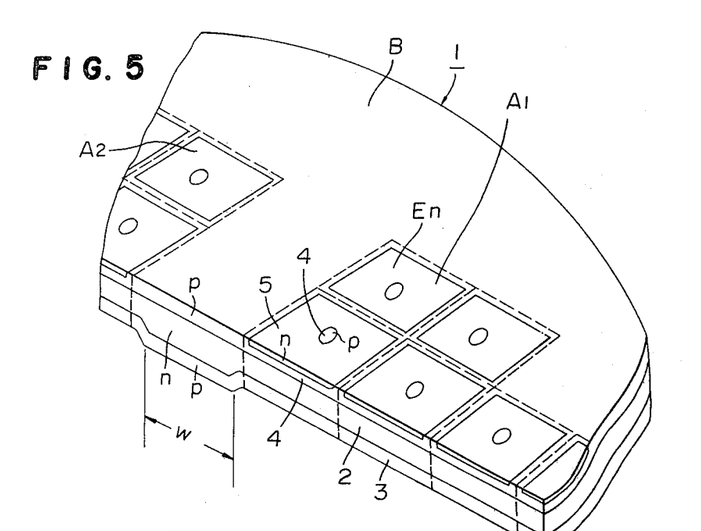
FIGS. 5 to 8 are respectively partial schematic views of the other embodiments of the semiconductor wafers prepared by the process of the present invention.

In the embodiment of FIG. 4, the thickness of the reinforcing region B on both of the surfaces of the wafer (1) is thicker. However, the thickness of the reinforcing region B on one surface can be thicker. In this case, the surface can be selected under the consideration of the use of photo-mask in the step of forming the pattern of the pellets E. The semiconductor wafer prepared under the consideration is shown in FIG. 5.

In this case, the p-type layers (3), (4) are formed by a diffusion on both of the surfaces of the n-type substrate (2) and the n-type layers (5) corresponding to the thyristor pellets are formed on the surface of the p-type layer (4). Then, each opening is formed in the outer n-type layer (5) to expose the p-type layer (4) from the openings.

In this case, the reinforcing regions B are formed between the semiconductor pellet-forming regions $A_1$ to $A_2$ and the peripheral part and the thickness of the wafer at the reinforcing regions B is increased.

In this case, precise sizes should be given in the formations of the outer n-type layer (5) and the openings, whereby the pattern mask for forming them is prepared by the photo-resist method. In order to apply the photo-resist method, it is disadvantageous to have unevenness on the surface. When the surface has unevenness, it is difficult to closely contact a negative film for exposing the pattern on the photo-resist, on the surface of the wafer, whereby it is difficult to obtain a shape pattern.

Accordingly, the semiconductor pellet-forming regions $A_1$ to $A_4$ are formed by etching only one surface of the wafer without forming unevenness on the rare surface to form the reinforcing regions B having thicker thickness than that of the pellet-forming regions $A_1$ to $A_4$.

In accordance with the method, the present invention can be applied for forming transistors having complicated pattern as well as thyristors.

Figure 6:
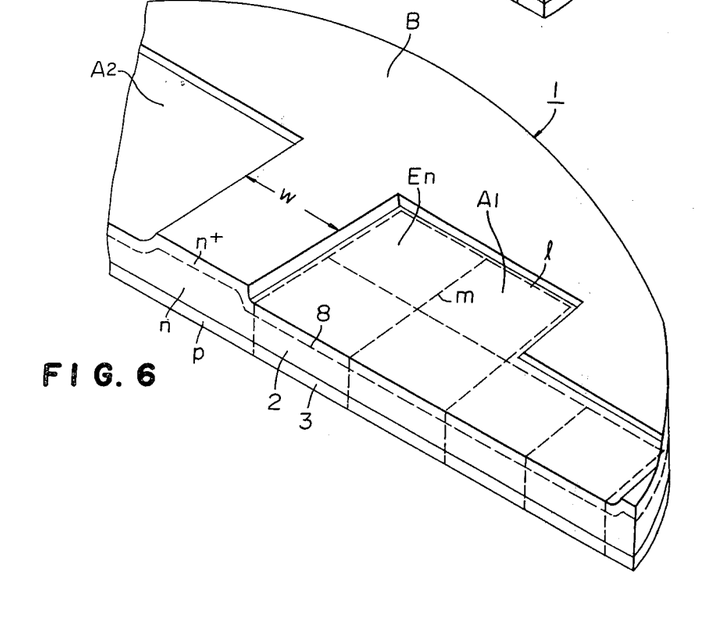

FIG. 6 is a partial sectional view of one embodiment of a diode prepared by the process of the present invention.

In the semiconductor wafer (1), four pellet-forming regions $A_1$ to $A_4$ are formed and the reinforcing regions B are formed between the pellet-forming regions and the peripheral part thereof.

The thickness of the semiconductor wafer (1) at the reinforcing regions B is thicker than that of the pellet-forming regions $A_1$ to $A_4$ to reinforce the semiconductor wafer (1). Of course, a plurality of the semiconductor pellets E are formed in each of pellet-forming regions $A_1$ to $A_4$. The preparation of the semiconductor pellets E and the preparation of the semiconductor devices by using the semiconductor pellets can be as follows.

The p-type layer (3) is formed on one surface of the n-type substrate (2) of the semiconductor wafer (1) and the $n^+$-type low resistant layer (8) is formed on the rare surface by the diffusion method. Then, electrodes (not shown) which are brought on ohmic contacts are formed on both of the surfaces of the semiconductor wafer (1) that is the surfaces of the p-type layer (3) and the $n^+$-type low resistant layer (8). The electrodes are usually formed by plating with nickel and further plating gold. The semiconductor wafer (1) is cut along the lines l and m in FIG. 6 into the pellets $E_1, E_2 \ldots E_n$. The semiconductor pellet is mounted on a header and electrode lead-wires are connected and the surface is cleaned and the surface protective material is coated and it is sealed with a cap to prepare the semiconductor device.

In this case, the semiconductor wafer (1) having a thickness of 330μ and a diameter of 75 mm is used, and the pellet-forming regions $A_1$ to $A_4$ are formed by selective etching to give a thickness of 80 to 100μ. The width W of the reinforcing regions B remained without etching which are formed between the pellet-forming regions $A_1$ to $A_4$ is given so as to be similar to one side of the pellet E of about 3.6 mm and the minimum width of the reinforcing region at the peripheral part is given to be 3.6 mm.

In the resulting semiconductor wafer (1), the pellet-forming regions $A_1$ to $A_4$ have a thickness of 230 to 250μ being suitable for forming the pellets and they are reinforced by the reinforcing regions B having a thickness of 330μ. Accordingly, even though it has a diameter of 75 mm, the break of the wafer can be prevented in the following steps.

In the embodiment, the percent of defective caused by the break of the wafer during the processing is only about 5% which is the same with that of the plane wafer having a diameter of 50 mm and a thickness of 240 to 260μ.

Figures 7, 8:
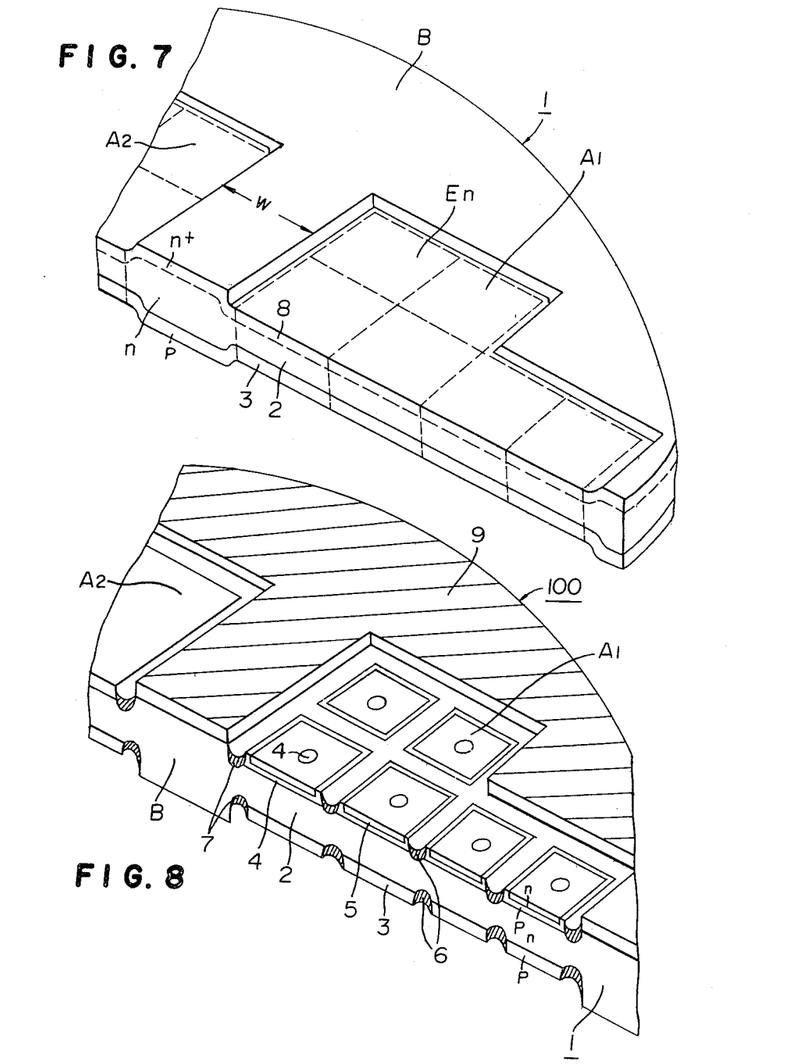

FIG. 7 shows the other embodiment of the semiconductor wafer being suitable for preparing diodes and it is a partial schematic view corresponding to FIG. 3.

The embodiment is further to improve the percent of defective caused by the break of the wafer.

The pellet-forming regions $A_1$ to $A_4$ of the semiconductor wafer (1) are formed by the chemical etching to give the thickness of 80 to 100μ.

In the embodiment of FIG. 6, the semiconductor wafer having a thickness of 330μ is used, however, the wafer having a thickness of 410 to 430μ can be used in this embodiment.

The thickness of the reinforcing regions B is thicker corresponding to the thickness of the wafer, whereby the break of the wafer is further prevented to reduce to substantially zero of the percentage of defective.

The percentage of defective caused by the break of the wafer is related to the thickness of the reinforcing region B. The percent of defective can be reduced by increasing the width W of the reinforcing regions B. When the width W is large, the number of the semiconductor pellets obtained from one sheet of the wafer is small and the advantage of the use of a larger wafer (1) is decreased. Accordingly, the width W of the reinforcing regions B can be decided from these viewpoints.

In the embodiments of FIGS. 6 and 7, about 220 pieces of the semiconductor pellets can be obtained from a sheet of the wafer. In the conventional process using the wafer having a diameter of 50 mm, only 120 pieces of the semiconductor pellets could be obtained. The increase of the number of the pellets obtained by one operation is remarkably advantageous because of lowering the processing cost and also lowering total cost.

In the above-mentioned embodiments, the wafer having high strength is obtained by the chemical etching of the pellet-forming regions from the thicker wafer. Thus, it is also possible to prevent the break of the semiconductor wafer having a large diameter by forming p-n junctions in the pellet-forming regions of the semiconductor wafer and then, increasing the thickness of the reinforcing regions by a formation of alloy or an epitaxial growth with a metal or a semiconductor having the same thermal expansion coefficient with that of the substrate of the wafer and then forming the mesa grooves and coating the surface protective material.

FIG. 8 is a partial schematic view of one embodiment of the semiconductor wafer prepared by said process. In the embodiment, a wafer (1) having the same thickness in both of the pellet-forming regions $A_1$ to $A_4$ and the reinforcing regions B and the reinforcing silicon layer (9) is selectively formed on the reinforcing regions B to give the thickness of the reinforcing regions B being thicker than that of the pellet-forming regions $A_1$ to $A_4$.

The semiconductor wafer (100) can be prepared as follows.

Figure 9A:
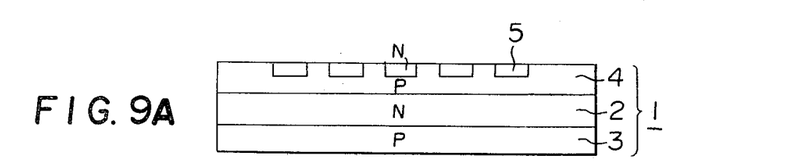
FIGS. 9(A),(B),(C) are sectional views for illustrating steps of preparing the semiconductor wafer of FIG. 8.
Figure 9B:
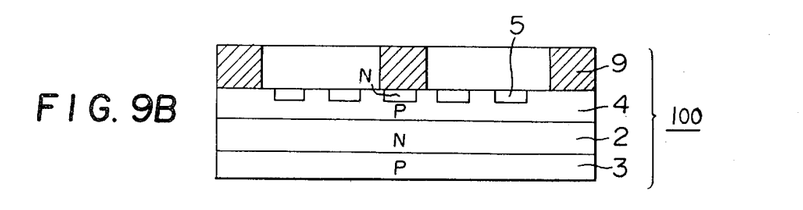

As shown in FIG. 9(A), the p-type anode layer (3), the p-type base layer (4), the n-type cathode layer (5) are formed in the pellet-forming regions of the silicon wafer having a thickness of 240 to 250μ. As shown in FIG. 9(B), a reinforcing silicon layer (9) having a thickness of about 300μ is formed by alloying with aluminum as a solder to prepare the reinforced silicon wafer (100).

Figure 9C:
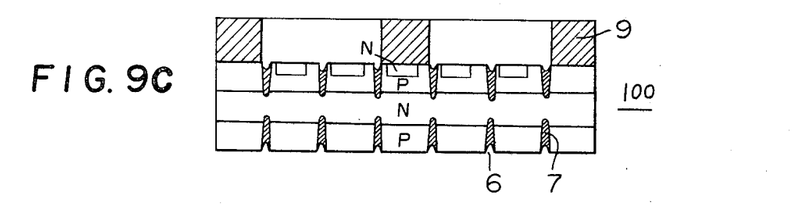

As shown in FIG. 9(C), on the silicon wafer (100), the mesa grooves (6) are formed at the predetermined position and the surfaces of the grooves are covered with the surface protective material (7) of frit. The resulting reinforced silicon wafer (100) has higher strength against the break to reduce the percent of break of the wafer after forming the mesa grooves to less than 5%.

In this embodiment, it is preferable to use the same semiconductor material as the reinforcing material to the semiconductor substrate from the viewpoint of the same thermal expansion coefficient. However, the other metal having the same thermal expansion coefficient such as molybdenum can be also used. The semiconductor single crystal usually has cleavage property along the direction of crystallographic axis to be easily broken. When the same semiconductor material is used as the reinforcing material, the cleavage of the wafer can be prevented by shifting the crystallographic axis each other. When polycrystalline semiconductor material is used instead of the single crystalline semiconductor material, the same effect can be attained as the polycrystalline semiconductor has not cleavage property.

It is also possible to result the epitaxial growth to grow a single crystalline or polycrystalline material on the specific parts as the reinforcing material or it is also possible to bond a semiconductor material with an oxide film formed by oxidizing the semiconductor in an oxidizing atmosphere. In the latter case, it is preferable to form the mirror surfaces for the surfaces of the reinforcing material and the semiconductor substrate.

In these embodiments, the pattern of the reinforcing regions of the peripheral part and the + shape parts connecting to the peripheral part and crossing at the center as shown in FIG. 2 is considered. However, the pattern can be modified as desired.

Figure 10:
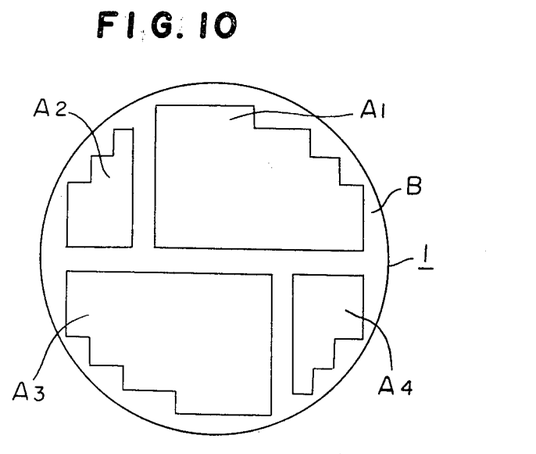
FIGS. 10 and 11 are respectively plane views of the other embodiments of patterns of pellet-forming regions and reinforcing regions on the wafer.

FIG. 10 is a plane view of the other embodiment of the pattern of the pellet-forming regions and the reinforcing regions on the wafer prepared by the process of the present invention. In FIG. 10, the pellet-forming regions $A_1$ and $A_3$ have the same shape and the regions $A_2$ and $A_4$ have the same shape and the region $A_1$ is larger than the region $A_2$. The reinforcing regions B are formed at the peripheral part and the parts between the pellet-forming regions $A_1$ to $A_4$.

Figure 11:
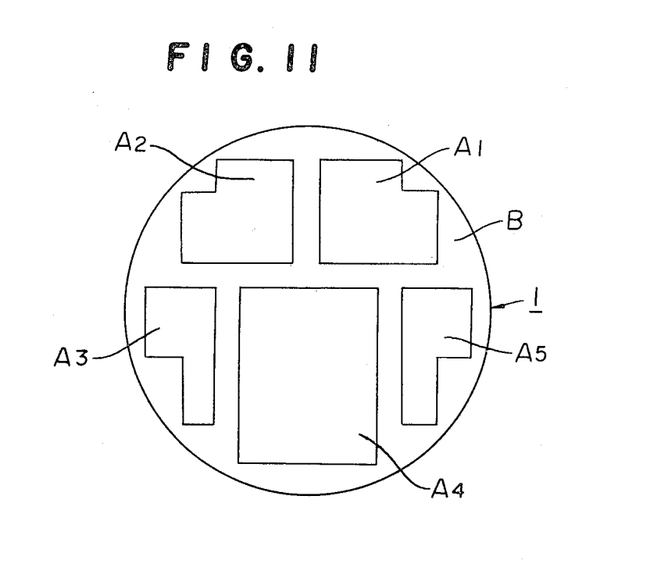

In FIG. 11, the pellet-forming regions $A_1$ to $A_5$ are formed and the regions $A_1$ and $A_2$ have the same shape and the regions $A_3$ and $A_5$ have the same shape and the region $A_1$ is larger than the region $A_3$ and the region $A_4$ is larger than the region $A_1$. The reinforcing regions B are also formed at the peripheral part and the parts between the pellet-forming regions $A_1$ to $A_5$.

In both of FIGS. 10 and 11, the shape of the pellet-forming regions is advantageous along the arrangements of the pellets for the increase of yield of the pellets.

Figure 12:
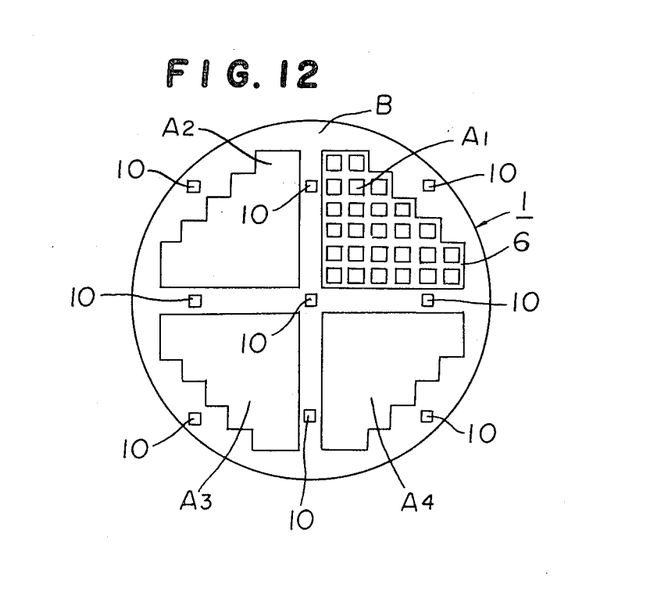
FIG. 12 is a plane view of a wafer showing alignment marks for arranging marks on the pattern of the wafer.

In the preparation of the semiconductor pellets, the alignment marks used for arranging a mask in the photoresist method have been formed in the parts for the pellets and more than 4 of alignment marks have been formed in a wafer so as to attain the arrangement of the mask even though the wafer is broken in the step. The fact causes to decrease the yield of the pellets. However, this has been indispensable from the viewpoints of the arrangement of the mask and the save in the break of the wafer. However, when the reinforcing regions are formed, many alignment marks can be formed on the reinforcing regions without affecting to the yield of the pellets. FIG. 12 is a plane view of the embodiment applied to the pattern of FIG. 2.

The reinforcing regions B are formed at the peripheral part and the part connecting to the peripheral part and crossing at the center and 9 of the alignment marks (10) are formed on the reinforcing regions B whereby the arrangement of the mask can be attained. Even though the wafer (1) is broken, the alignment mark (10) is remained in each broken piece. The arrangement of the mask can be attained with the remained alignment mark. Accordingly, the save in the break of the wafer can be attained. On the pellet-forming regions $A_1$ to $A_4$, no alignment mark (10) is formed whereby the marks do not affect the yield of the pellets.

The alignment marks (10) are preferable formed to be kept in the reinforcing regions B so as to prevent the reinforcing effect by cutting the reinforcing region B.

As described above, in accordance with the process of the present invention, a plurality of the semiconductor pellet-forming regions are formed in the preparation of a plurality of semiconductor pellets from one sheet of the semiconductor wafer and the other parts are used as the reinforcing regions and the wafer having a large diameter can be used under maintaining the thickness of the semiconductor pellets-forming regions in constant without the increase of percent of defective caused by the break of the wafer, whereby the number of the pellets obtained from one sheet of the wafer is remarkably increased to reduce the processing cost.

The process of the present invention can be applied not only to prepare thyristors and diodes but also other semiconductor devices for forming pellets in a form of a wafer such as bilateral thyristors and transistors.

What is claimed is:

1. In a process for preparing semiconductor devices by forming a plurality of semiconductor pellets in one sheet of a semiconductor wafer and dividing the wafer along the boundaries of the semiconductor pellets, an improvement which comprises forming reinforcing regions on said wafer adjacent said plurality of semiconductor pellets and on the periphery of said wafer to thereby divide said plurality of semiconductor pellets into a plurality of completely enclosed and separated regions, with each of said separated regions containing a plurality of said semiconductor pellets wherein said reinforcing regions adjacent said pellets have a specified width, whereby breakage of said sheet of semiconductor wafer is substantially reduced.

2. A process according to claim 1 wherein the semiconductor pellets are separated by mesa grooves formed on at least one surface of the semiconductor wafer.

3. A process according to claim 1 wherein the thickness of the reinforcing regions of the semiconductor wafer is thicker than the thickness of said plurality of semiconductor pellets.

4. A process according to claim 3 wherein the difference of the thickness of the reinforcing regions from the thickness of said plurality of semiconductor pellets is formed by projecting the reinforcing regions on only one surface of the wafer.

5. A process according to claim 3 wherein the difference of the thickness of the reinforcing regions from the thickness of said plurality of semiconductor pellets is formed by projecting the reinforcing regions on both surfaces of the wafer.

6. A process according to claim 3 wherein the difference of the thickness of the reinforcing regions from the thickness of said plurality of semiconductor pellets is formed by etching said plurality of semiconductor pellets on the wafer.

7. A process according to claim 1 wherein alignment marks for arranging photo-mask are formed on the reinforcing regions.

8. A process according to claim 1 wherein said plurality of semiconductor pellets is divided into at least four completely enclosed and separated regions.

* * * * *